United States Patent [19]

Mori et al.

[11] Patent Number: 4,810,886
[45] Date of Patent: Mar. 7, 1989

[54] ELECTRON MICROSCOPE

[75] Inventors: Nobufumi Mori; Takayuki Katoh; Junji Miyahara, all of Kanagawa; Tetsuo Oikawa; Yoshiyasu Harada, both of Tokyo, all of Japan

[73] Assignees: Fuji Photo Film Co., Ltd., Kanagawa; Jeol Ltd., Tokyo, both of Japan

[21] Appl. No.: 140,989

[22] Filed: Jan. 5, 1988

[30] Foreign Application Priority Data

Jan. 13, 1987 [JP] Japan ................... 62-5390

[51] Int. Cl.$^4$ ..................... H01J 37/26; H01J 37/244
[52] U.S. Cl. ..................... 250/311; 250/397
[58] Field of Search ........... 250/311, 397, 310, 306, 250/311, 310, 397, 306

[56] References Cited

U.S. PATENT DOCUMENTS 3,327,112 6/1967 Akahori ..................... 250/311
3,671,742 6/1972 Browning ..................... 250/311

FOREIGN PATENT DOCUMENTS 0168838 1/1965 European Pat. Off. .

Primary Examiner—Bruce C. Anderson
Assistant Examiner—Jack I. Berman
Attorney, Agent, or Firm—Webb, Burden, Ziesenheim & Webb

[57] ABSTRACT

A transmission-type electron microscope using a sensitive two-dimensional sensor in its micrograph-taking section acts as a recording medium for an electron beam. When the sensor is illuminated with an electron beam, it stores the energy of the beam. When the sensor is subsequently illuminated with light, it releases the stored energy as light. In accordance with the invention, at least a portion of the micrograph-taking section includes a member for reducing the amount of x-rays produced or a member for absorbing x-rays to shield the sensor from x-rays.

6 Claims, 2 Drawing Sheets

ELECTRON MICROSCOPE

FIELD OF THE INVENTION

The present invention relates to an electron microscope which uses a two-dimensional sensor consisting of a storage-type phosphor sheet or the like to obtain electron micrographs and, more particularly, to an electron microscope equipped with means for shielding such a two-dimensional sensor from x-rays.

BACKGROUND OF THE INVENTION

In a transmission-type electron microscope, an electron beam transmitted through a filmy specimen is imaged by an imaging lens system to obtain an electron optical image of the specimen. Generally, this electron optical image is visualized with a photosensitive material. It is the common practice to use a photographic film to which emulsion has been applied as the photosensitive material.

Referring to FIG. 1, the structure of a conventional electron microscope using photographic films is shown. The microscope includes a microscopic column 1 in which an electron optical system for obtaining an electron optical image is housed. A camera chamber 2 is provided to visualize the electron optical image. An electron gun 3 for producing an electron beam 4 is mounted in the microscopic column 1. The beam 4 is converged by condenser lenses 5 and impinges upon a filmy specimen 6. An objective lens 7 and magnifying lenses 8 constitute an imaging lens system which produces a magnified electron optical image of the specimen from the electron beam transmitted through the specimen 6.

The electron optical image is made visible by a micrograph-taking section including a shutter, a fluorescent screen 25, and the camera chamber 2. The fluorescent screen 25 consists of an aluminum plate 25a and a fluorescent substance layer 25b coated on the one side surface of the aluminum plate 25a. The visible image on the fluorescent screen 25 is observed through the observation window 26. The shutter 9 is disposed near the bottom of the microscopic column 1. A feeding magazine 12 holding unexposed films, a receiving magazine 13 holding exposed films 15, and a carrying mechanism 10 are mounted in the camera chamber 2. The mechanism 10 carries a film 11 from the feeding magazine 12 into a location where the film is exposed to the electron optical image. Then, the mechanism 10 moves the film from the exposure position into the receiving magazine 13. A mask 16 is disposed above the film 11 located in the exposure position to determine the field of view. During exposure operation, the fluorescent screen 25 is vertically inclined upwardly toward the axis of the microscope as shown by 25', so that the electron optical image is projected upon the film 11 through the magnifying lenses 8. The electron optical image is projected upon the film supplied from the feeding magazine 12 for a period determined by the shutter 9. The exposed film is then received in the receiving magazine 13.

In the electron microscope shown in FIG. 1, the electron beam 4 impinges upon the shutter 9 immediately before and after the exposure operation, thus producing x-rays. During the exposure operation, the electron beam 4 hits the mask 16, also producing x-rays. Because the conventional electron microscope uses a photographic film as a recording medium, and because the photographic film is insensitive to x-rays, it is possible to expose the film only to the electron optical image. Hence, the produced x-rays present no problems.

In recent years, a new electron microscope system making use of a two-dimensional sensor to store the energy of an electron beam has been proposed. In particular, the sensor consists of a storage-type phosphor sheet or the like. An electron optical images is recorded on the sensor. Then, the sensor is illuminated with light or heated to release the stored energy as light. The emitted light is photoelectrically detected to produce an image signal. A transmission electron micrograph of a specimen is reconstructed from the image signal (see European patent application No. 0168838). Generally, two-dimensional sensors of this kind are sensitive to x-rays and, therefore, they are exposed to x-rays produced from the shutter 9 and the mask 16 as well as to extraneous x-rays. These undesired x-rays are superimposed on the electron optical image. As a result, the obtained electron micrograph is blurred.

When the aforementioned two-dimensional sensor is exposed to an electron beam, it temporarily stores at least a portion of the energy of the beam. When the sensor is subsequently excited externally, at least a portion of the stored energy is released in a detectable form, such as light, electricity, and sound.

FIG. 2 is a cross-sectional view of a stimulable phosphor sheet adapted for the above-described two-dimensional sensor, the sheet being stimulated by stimulating rays. The stimulable phosphor sheet, indicated by numeral 22, comprises a support 23 and a stimulable phosphor layer 24 formed on the base 23. The base 23 can be a sheet of polyethylene or plastic film of about 100 to 200 μm thick, a sheet of aluminum of 0.5 to 1 mm thick, a sheet of glass of 1 to 3 mm thick, or the like. The base 23 may or may not be transparent. Where the base is opaque, the light emitted from the stimulable phosphor sheet is detected from the same side as the stimulating rays impinged. Where the base is transparent, the emitted light can be detected from the opposite side to the stimulating rays impinged on both sides.

The stimulable phosphor used in the stimulable phosphor sheet of the two-dimensional sensor employed in the present invention can be:

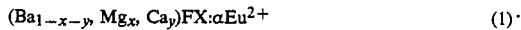

$$(Ba_{1-x-y}, Mg_x, Ca_y)FX:\alpha Eu^{2+} \qquad (1)$$

where X is at least one of Cl and Br; and x and y satisfy the conditions $0 < x + y \leq 0.6$ and $xy \neq 0$; and $\alpha$ satisfies the condition $10^{-6} \leq \alpha \leq 5 \times 10^{-2}$. This is described in Japanese Patent Unexamined Laid Open No. 12143/1980.

$$LnOX: xA \qquad (2)$$

where Ln is at least one selected from the group consisting of La, Y, Gd and Lu; X is at least one of Cl and Br; A is at least one of Ce and Tb; and x satisfies the condition $0 < X < 0.1$. This is described in U.S. Pat. No. 4,236,078.

$$ti\ M^{II}FX.XA: yLn \qquad (3)$$

where $M^{II}$ is at least one selected from the group consisting of Ba, Ca, Sr, Mg, Zn and Cd; A is at least one selected from the group consisting of BeO, MgO, CaO, SrO, BaO, ZnO, $Al_2O_3$, $Y_2O_3$, $La_2O_3$, $In_2O_3$, $SiO_2$, $TlO_2$, $ZrO_2$, $Geo_2$, $SnO_2$ $Nb_2O_5$ $Ta_2O_5$ and $ThO_2$; Ln is at least one selected from the group consisting of Eu, Tb, Ce, Tm, Dy, Pr, $H_o$, Nd, Yb, Er, Sm and Gd; X is at least one selected from the group consisting of Cl, Br and I; x satisfies the condition $5 \times 10^{-5} < X \leq 0.5$; and y satisfies the condition $0 < y \leq 0.2$. This stimulable phosphor is described in U.S. Pat. No. 4,539,138.

$$BaFX \cdot xNaX': \alpha Eu^{2+} \qquad (4)$$

where each of X and X' is at least one of Cl, Br and I; x satisfies the condition $0 < X \leq 2$; and satisfies the condition $0 < \alpha \leq 0.2$. This stimulable phosphor is described in Japanese Patent Unexamined Laid Open No. 56479/1984.

$$M^{II}X_2 \cdot \alpha M^{II}X'_2 : xEu^{2+} \qquad (5)$$

where $M^{II}$ is at least one alkaline-earth metal selected from the group consisting of Ba, Sr and Ca; each of X and X' is at least one halogen selected from the group consisting of Cl, Br and I; X and X' are different halogens ($X \neq X'$); $\alpha$ is a numerical value satisfying the condition $0.1 \leq \alpha \leq 10.0$; x is a value satisfying the condition $0 < x \leq 0.2$. This stimulable phosphor is described in Japanese patent application No. 84381/1985 (U.S. Ser. No. 834,886), and can contain an additive as described in Japanese patent application No. 166379/1985 (corresponds to European patent application No. 151,494) or 221483/1985 (U.S. Ser. No. 947,631, European patent application No. 159,014).

Other usable storage-type fluorescent substances are described in U.S. Pat. Nos. 3,859,527, 4,236,078, 4,239,968, 4,505,989 and Japanese patent application Nos. 116777/1981, 23673/1982, 23675/1982, 69281/1983, 206678/1983 (U.S. Ser. No. 841,044, European patent application No. 95741), 27980/1984 (European patent application No. 101,030), 47289/1984 (European patent application No. 103,302), 752200/1984 (European patent application No. 107,192) and 101173/1985. Any one of these storage-type fluorescent substances is dispersed in a suitable binder and applied to the support 23 up to a thickness of 1000 microns. If a stimulable phosphor layer can sustain itself, it can form a stimulable phosphor sheet by itself.

When a stimulable phosphor sheet formed in this way is exposed to an electron beam or other radiation, some of the energy of the radiation is stored in the stimulable phosphor. Subsequently, the sheet is exposed to stimulating rays such as visible light. As a result, the fluorescent substance fluoresces according to the stored energy. Instead of the stimulable phosphor stimulated by light, a thermal phosphor can be used which releases the stored energy when heated after it stores radiation energy. In this case, the thermal phosphor is sulfate, such as $Na_2SO_4$, $MnSO_4$, $CaSO_4$, $SrSO_4$ or $BaSO_4$, to which a trace of at least one of the additives Mn, Dy and Tm is added. The thermal phosphor sheet is fabricated in the same manner as the aforementioned stimulable phosphor sheet.

A two-dimensional sensor made of the above-described stimulable phosphor sheet or thermal phosphor sheet is placed in the focal plane of an electron microscope. A transmission electron optical image is stored in this sensor, which is scanned either with stimulating rays such as visible light or with a heat source so that it may emit light. The resulting emitted light is detected photoelectrically. As a result, an electric signal corresponding to the transmission electron optical image can be obtained. The signal derived in this way can be fed to a display unit such as a CRT to make visible the electron optical image, or it can be permanently recorded in the form of hard copy. It is also possible to temporarily store the image signal on a recording medium such as magnetic tape or magnetic disk.

In the above-described electron microscope system, an electron optical image is recorded on a two-dimensional sensor consisting of a storage-type phosphor sheet or the like. Since the sensitivity of the sensor to the electron optical image is high, it is possible to reduce the amount of electron beam impinging upon a specimen under observation. This reduces the damage done to the specimen. Also in this system, the obtained electron micrograph can e quite easily and variously processed. Digitization of image signals and analysis of images and diffraction patterns can be more easily and repaidly performed by applying the aforementioned electric signal to a computer.

SUMMARY OF THE INVENTION

It is an object of the present invention to provide an electron microscope in which a two-dimensional sensor is shielded from undesired x-rays, such as x-rays produced from the micrograph-taking section including a shutter and a mask, scattered x-rays, and extraneous x-rays, to obtain a clear electron micrograph purely from an electron optical image.

The above object is achieved in accordance with the teachings of the invention by an electron microscope comprising an electron optical system for forming a magnified electron optical image of a specimen from an electron beam transmitted through the specimen and a micrograph-taking section using a two-dimensional sensor for recording the electron optical image, the electron microscope being characterized in that at least one component of the micrograph-taking section includes either a member for reducing the amount of produced x-rays or a member for absorbing the produced x-rays or both members.

In this structure, the amount of x-rays produced from the micrograph-taking section including a shutter and a mask is reduced. The two-dimensional sensor is shielded from scattered x-rays and extraneous x-rays. Consequently, a clear electron micrograph can be formed purely from the electron optical image.

DESCRIPTION OF THE PREFERRED EMBODIMENT

Figure 1:
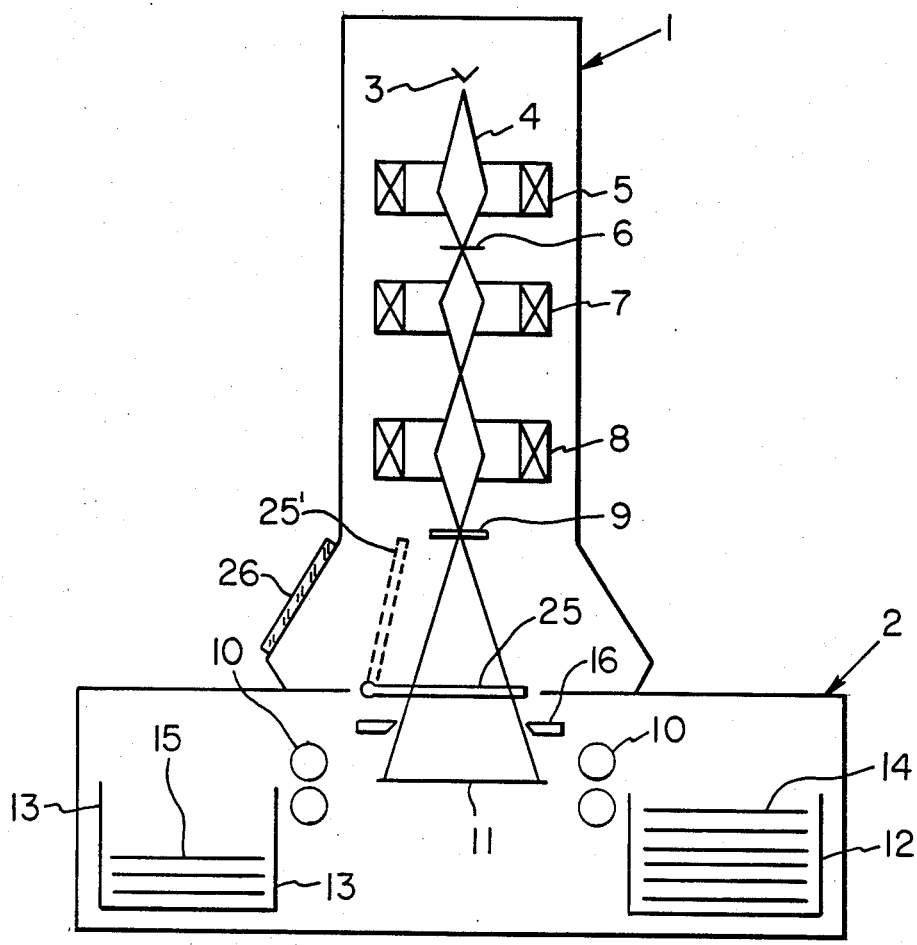
FIG. 1 is a diagram of a conventional electron microscope using a photographic film.
Figure 2:
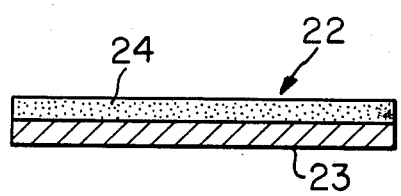
FIG. 2 is a cross-sectional view of a two-dimensional sensor for use in the present invention.
Figure 3:
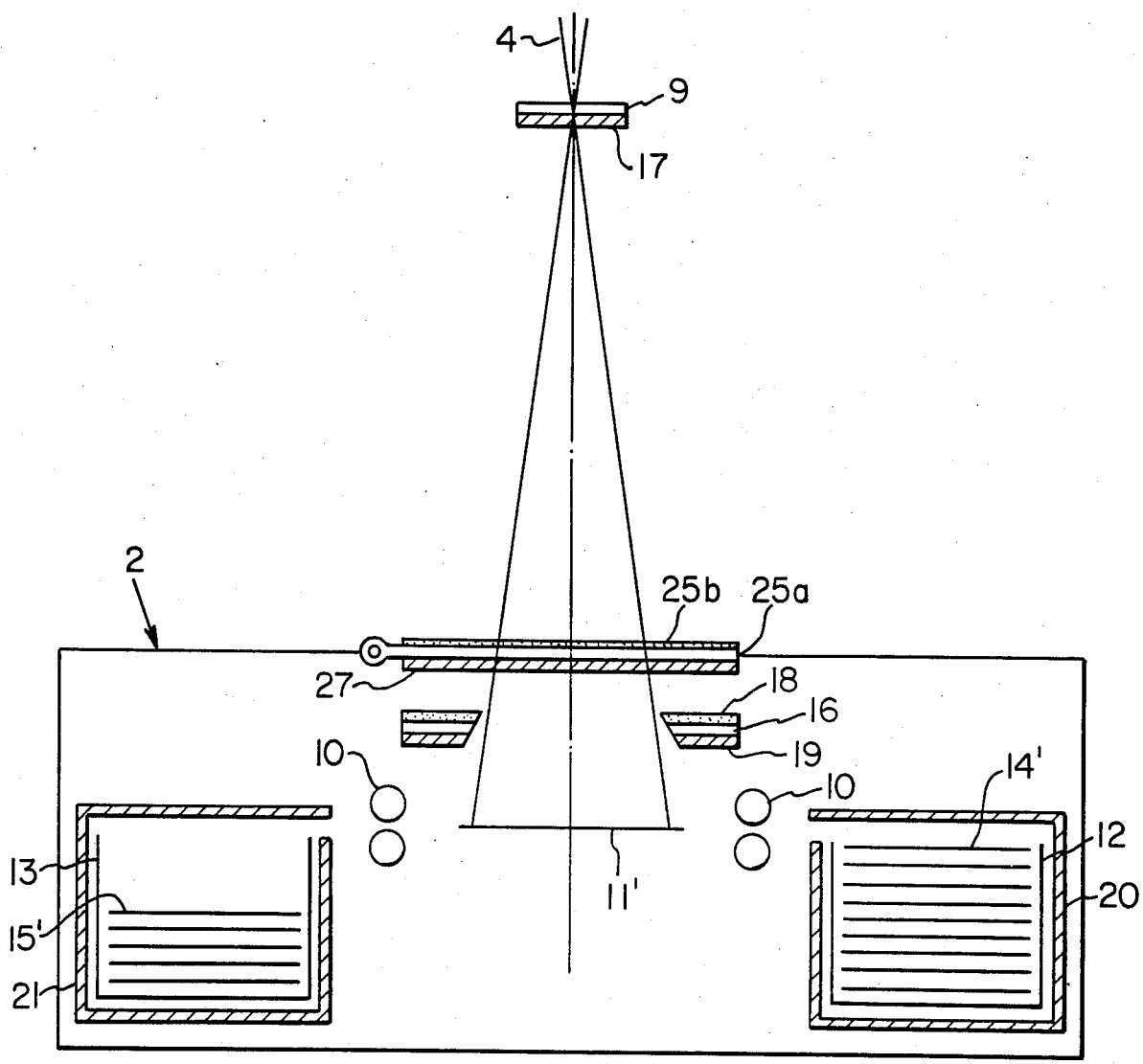
FIG. 3 is a diagram of the micrograph-taking section of an electron microscope according to the invention.

Referring to FIG. 3, there is shown the micrograph-taking section of an electron microscope according to the invention. The micrograph-taking section is equipped with means for reducing or absorbing x-rays. It is to be noted that like components are denoted by like reference numerals throughout all the figures. Also shown in FIG. 3 are a storage-type phosphor sheet 11', unexposed storage-type phosphor sheets 14', exposed storage-type phosphor sheets 15', an x-ray absorber member 17, a member 18 for reducing the amount of x-rays, and x-ray absorber members 19, 20 and 21.

When the electron beam 4 strikes the fluorescent screen 25, x-rays are produced. The x-rays are absorbed by the absorber member 27 made of lead or the like. When the electron beam 4 also strikes the shutter 9, x-rays are produced. The x-rays are absorbed by the absorber member 17 made of lead or the like. The shutter 9 may be replaced by the electronic shutter means using an aperture and the deflector means for deflecting the electron beam.

It is possible to link the operation of the shutter means 9 and the mechanism 10, so that the phosphor sheet 11' is located at the exposure position only during the exposure operation.

The member 18 for reducing the amount of x-rays is mounted on the upper surface of the mask 16. The member 18 is composed of a light element, such as carbon or beryllium. The x-ray absorber member 19 composed of a heavy element, such as lead or iron, is mounted on the lower surface of the mask 16. The member 18 reduces the amount of x-rays produced when the electron beam 4 strikes the mask 16. The produced x-rays are absorbed by the member 19. Thus, the x-rays are prevented from impinging upon the storage-type phosphor sheet 11'. If the mechanical strength allows, the mask can be fabricated from only the two members 18 and 19.

The x-ray absorber members 20 and 21 prevent x-rays from scattering inside the camera chamber 2, and shield the phosphor sheets 14' and 15', respectively, inside the feeding magazine 12 and the receiving magazine 13, respectively, from extraneous x-rays.

It is possible to fabricate each magazine itself from a material that does not transmit x-rays, instead of arranging the x-ray absorber members 20 and 21 around the magazines.

The inner or outer surface of the camera chamber may be so formed that the amount of x-rays produced is small or that it hardly transmits x-rays, or scattering of x-rays may be reduced.

As described above, the novel electron microscope uses a two-dimensional sensor consisting of a storage-type phosphor sheet or the like on which an electron optical image is recorded, and has a micrograph-taking section equipped either with a member for reducing the amount of x-rays produced or with a member for absorbing x-rays or with both members. Consequently, the amount of x-rays produced from a shutter, a mask, and other components is reduced. The sensor is shielded from scattering x-rays and extraneous x-rays. Hence, a clear electron micrograph can be formed purely from an electron optical image.

Having thus described our invention with the detail and particularity required by the Patent Laws, what is claimed and desired to be protected by Letters Patent is set forth in the following claims.

What is claimed is:

1. An electron microscope comprising:
   an electron optical system for forming a magnified electron optical image of a specimen from an electron beam transmitted through the specimen; and
   a micrograph-taking section using a two-dimensional sensor which records the electron optical image and which, when illuminated with light or heated, releases the energy stored in it as light that can be detected to thereby produce an image signal,
   and a member for absorbing x-rays disposed on the lower surface of a shutter member included in the micrograph-taking section, the lower surface facing away from the electron beam.

2. An electron microscope comprising:
   an electron optical system for forming a magnified electron optical image of a specimen from an electron beam transmitted through the specimen; and
   a micrograph-taking section using a two-dimensional sensor which records the electron optical image and which, when illuminated with light or heated, releases the energy stored in it as light that can be detected to thereby produce an image signal,
   and a member for absorbing x-rays disposed on the lower surface of a fluorescent screen included in the micrograph-taking section, the lower surface facing away from the electron beam.

3. An electron microscope comprising:
   an electron optical system for forming a magnified electron optical image of a specimen from an electron beam transmitted through the specimen; and
   a micrograph-taking section using a two-dimensional sensor which records the electron optical image and which, when illuminated with light or heated, releases the energy stored in it as light that can be detected to thereby produce an image signal,
   and a member for reducing the amount of x-rays produced disposed on the upper surface of a mask which limits the field of view as viewed from the two-dimensional sensor and which is included in the micrograph-taking section, said upper surface facing toward the electron beam, and wherein a member for absorbing x-rays is disposed on the lower surface of the mask, said lower surface facing away from the electron beam.

4. An electron microscope as set forth in claim 1, 2 or 3, wherein an additional member for absorbing x-rays is so disposed as to cover the periphery of a magazine which is included in the micrograph-taking section and in which the two-dimensional sensor is received.

5. An electron microscope as set forth in claim 1, 2 or 3, wherein said micrograph-taking section includes a magazine for receiving the two-dimensional sensor, and wherein the magazine is made of an additional member for absorbing x-rays.

6. An electron microscope as set forth in claim 1, 2 or 3, wherein said member for absorbing x-rays consists of a material selected from the group of lead and iron.

* * * * *

UNITED STATES PATENT AND TRADEMARK OFFICE
CERTIFICATE OF CORRECTION

PATENT NO. : 4,810,886

DATED : March 7, 1989

INVENTOR(S) : Nobufumi Mori, Takayuki Katoh, Junji Miyahara, Tetsuo Oikawa and Yoshiyasu Harada.

It is certified that error appears in the above-identified patent and that said Letters Patent is hereby corrected as shown below:

Column 1 Line 58 after "film" insert --11--.

Column 2 Line 7 "images" should read --image--.

Column 2 Line 60 before "$M^{II}$" delete --ti--.

Column 3 Line 9 after "and" insert --$\alpha$--.

Column 4 Line 13 "e" should read --be--.

Column 4 Line 16 "repaidly" should read --rapidly--.

Signed and Sealed this

Twenty-first Day of November, 1989

*Attest:*

JEFFREY M. SAMUELS

*Attesting Officer*     *Acting Commissioner of Patents and Trademarks*